(12) United States Patent
Iino et al.

(10) Patent No.: US 6,407,329 B1
(45) Date of Patent: Jun. 18, 2002

(54) BACKSIDE COVERING MEMBER FOR SOLAR BATTERY, SEALING FILM AND SOLAR BATTERY

(75) Inventors: Yasuhiro Iino; Kaoru Otani; Kazuya Takano, all of Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/713,291

(22) Filed: Nov. 16, 2000

Related U.S. Application Data

(63) Continuation of application No. PCT/JP99/06726, filed on Dec. 1, 1999.

(30) Foreign Application Priority Data

Apr. 7, 1999 (JP) ............................................. 11-100335

(51) Int. Cl.[7] ............................................ H01L 31/048
(52) U.S. Cl. ..................... 136/251; 136/256; 428/421; 428/422; 428/446; 428/480; 428/438; 428/701; 428/702
(58) Field of Search ................................. 136/251, 256; 428/421, 422, 446, 480, 483, 701, 702; 438/64, 66

(56) References Cited

U.S. PATENT DOCUMENTS 6,222,115 B1 * 4/2001 Nakanishi .................. 136/251

FOREIGN PATENT DOCUMENTS

| EP | 0 680 096 | | 11/1995 |
| JP | 60-201652 A | * | 10/1985 |
| JP | 60-253253 | | 12/1985 |
| JP | 6-318728 | | 11/1994 |
| JP | 8-18086 | | 1/1996 |
| JP | 10-25357 A | * | 1/1998 |
| WO | WO 98/38683 A1 | * | 9/1998 |

* cited by examiner

*Primary Examiner*—Alan Diamond
(74) *Attorney, Agent, or Firm*—Kanesaka & Takeuchi

(57) ABSTRACT

A backside covering member is used as a protective member for protecting back sides of solar cells of a solar battery and to provide moistureproof property and durability. The backside covering member includes an outer film, a moistureproof film formed on the outer film and formed of a base film and a coating layer of an inorganic oxide deposited on a surface of the base film, and a reflection layer formed on a surface of the moistureproof film opposite to a surface on which the outer film is laminated. Ethylene-vinyl acetate copolymer adhesives are situated for sealing between the outer film and the moistureproof film and between the moistureproof film and the reflection layer.

8 Claims, 2 Drawing Sheets

BACKSIDE COVERING MEMBER FOR SOLAR BATTERY, SEALING FILM AND SOLAR BATTERY

CROSS REFERENCE TO RELATED APPLICATION

This is a continuation application of PCT/JP99/06726 filed on Dec. 1, 1999.

FIELD OF THE INVENTION

The present invention relates to a backside covering member to be used as a protective member for protecting back sides of solar cells of a solar battery, a sealing film and a solar battery employing the backside covering member. More particularly, the present invention relates to a backside covering member and a backside covering and sealing film which is excellent in moistureproof property and durability, further has good insulation performance, and does not cause leakage of current, and a durable, high-performance solar battery using the aforementioned backside covering member as a protective member.

BACKGROUND OF THE INVENTION

In recent years, solar cells which directly convert sunlight to electric energy are drawing the attention of people in view of effective utilization of natural materials and prevention against environmental pollution and thus its development is promoted.

A typical solar battery comprises a glass substrate 11 as a front side transparent protective member at a light-receiving side, a back side protective member (backside covering member) 12, ethylene-vinyl acetate copolymer (EVA) films 13A, 13B as sealing films arranged between the glass substrate 11 and the back side protective member 12, and solar cells or silicon photovoltaic elements 14 sealed by the EVA films 13A, 13B.

To manufacture this solar battery, the glass substrate 11, the sealing EVA film 13A, silicon photovoltaic elements 14, the sealing EVA film 13B and the backside covering member 12 are successively overlaid in this order and integrated together by heating and crosslinking the EVA.

The backside covering member 12 for solar battery is a resin film made of polyethylene monofluoride, white polyester, or the like for achieving light weight and thin wall.

It is primarily required for the backside covering member 12 to have excellent moistureproof property for preventing inside wirings or electrodes from corroding due to moisture and/or water permeation in addition to light weight and enough durability. However, the conventional resin film as the backside covering member can not have enough moistureproof property.

Generally known as moistureproof film is a film made by forming a metal coating film of material such as aluminum on a base film. However, when such a moistureproof film using metal such as aluminum is applied to a solar battery, there is possibility of current leakage. Accordingly, such a moistureproof film is inadequate as a moistureproof film used in a solar battery.

OBJECT AND SUMMARY OF THE INVENTION

The object of the present invention is to provide a backside covering member and a backside covering and sealing member, to be used as a protective member for protecting back sides of solar cells of solar battery, which is light and thin, is excellent in moistureproof property and durability, further has good insulation performance, and does not cause leakage of current, and a durable, high-performance solar battery using the aforementioned backside covering member as the back side protective member.

A backside covering member for solar battery of the present invention is used as a protective member for protecting back sides of solar cells of a solar battery, and is made by integrally laminating an outer film and a moistureproof film with ethylene-vinyl acetate copolymer (EVA) adhesives, wherein the moistureproof film is constituted of a base film and a coating layer of an inorganic oxide deposited on a surface of the base film.

The backside covering member for solar battery of the present invention is light and thin because it dose not employ any glass plate.

The moistureproof film has a coating layer of an inorganic oxide deposited on a surface of the base film, thereby obtaining high moistureproof property. In addition, since the moistureproof film is insulative, there is no possibility of current leakage. EVA adhesives having excellent adhesive property is used for integrally laminating the moistureproof film to the outer film, thereby improving the durability.

A backside covering and sealing member for solar battery of the present invention functions as a back side protective member of the solar battery and is made by integrally laminating the backside covering member for solar battery of the present invention and an ethylene-vinyl acetate copolymer film together, wherein the ethylene-vinyl acetate copolymer film is laminated to a surface of the backside covering member opposite to the outer film.

A solar battery of the present invention comprises solar cells which are sealed between a front side protective member and a back side protective member. The back side protective member is the backside covering member of the present invention.

DETAILED DESCRIPTION OF THE PREFERRED EMBODIMENTS

Hereinafter, embodiments of the present invention will be described with reference to the attached drawings.

Figure 1:
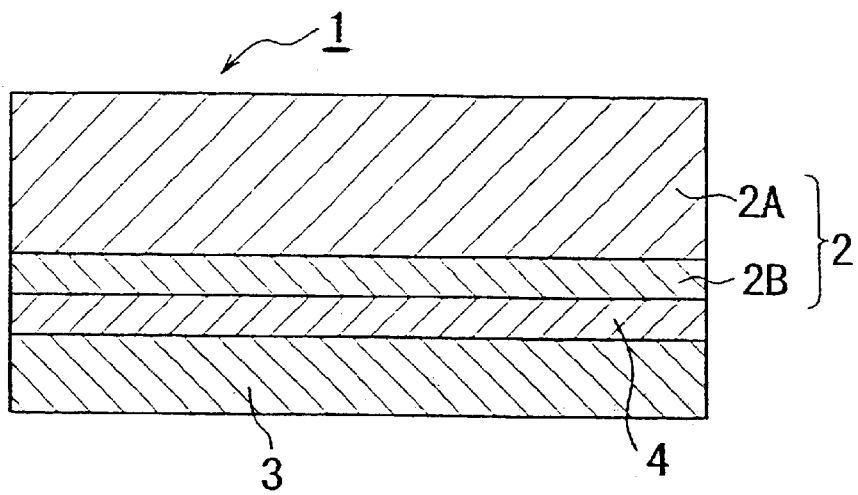
FIG. 1 is a sectional view showing an embodiment of the backside covering member for solar battery of the present invention.
Figure 2:
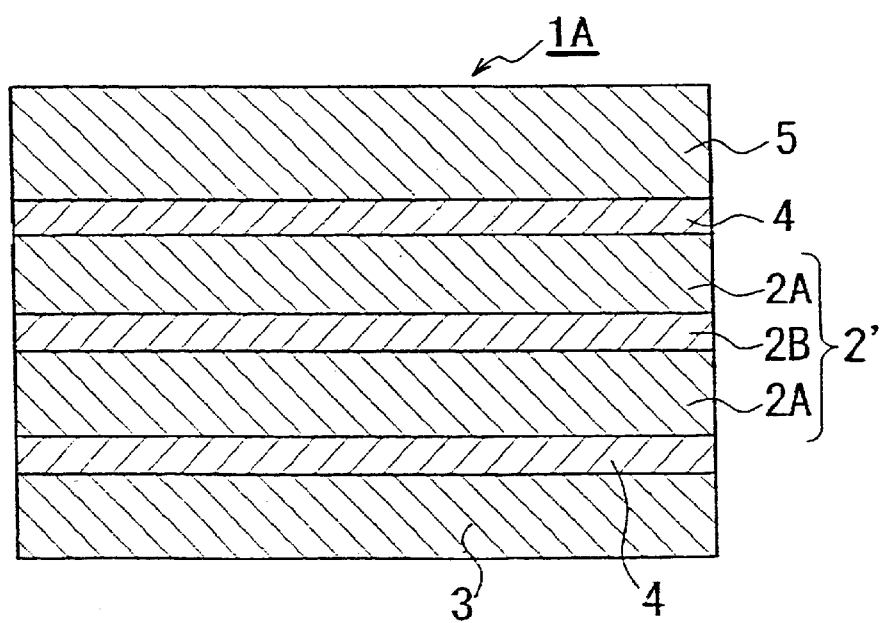
FIG. 2 is a sectional view showing another embodiment of the backside covering member for solar battery of the present invention.
Figure 3:
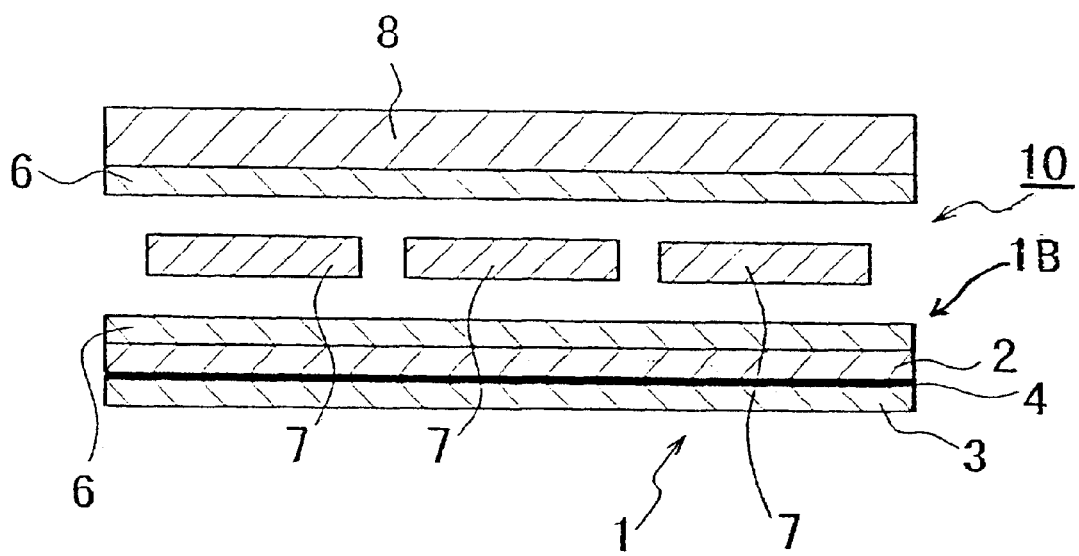
FIG. 3 is a sectional view showing an embodiment of the solar battery of the present invention.

FIGS. 1 and 2 are sectional views showing embodiments of the backside covering member for solar battery of the present invention, and FIG. 3 is a sectional view showing an embodiment of the solar battery of the present invention.

The backside covering member 1 shown in FIG. 1 is constituted of a moistureproof film 2 and an outer film 3 which are integrally laminated to each other via an EVA adhesive film (hereinafter, referred to as "EVA film") 4.

The moistureproof film 2 is preferably constituted of a transparent base film 2A including polyethylene terephthalate (PET) film and a moistureproof layer 2B formed on the film 2A by depositing inorganic oxide such as silica and alumina by CVD (Chemical Vapor Deposition) or PVD (Physical Vapor Deposition) method. The outer film 3 is bonded to the surface of the moistureproof layer 2B by the EVA film 4.

As shown in FIG. 1, the moistureproof layer 2B made of inorganic oxide such as silica and alumina formed on the base film 2A is easily scratched and/or stripped. Therefore, the moistureproof film 2 may be constituted of two base films 2A, 2A and a moistureproof layer 2B sandwiched by the base films 2A, 2A just like a backside covering member 1A as shown in FIG. 2 so that the moistureproof layer 2B is not exposed to outside. In the backside covering member 1A shown in FIG. 2, a reflection film 5 is bonded to a surface of a moistureproof film 2' opposite to the surface bonded to the outer film 3 by an EVA film 4. The reflection film 5 improves the efficiency for light utilization and thus improves the generation efficiency. The backside covering member 1A of lamination type may be prepared with two films each comprising a basic film such as a PET film and a moistureproof layer of inorganic oxide such as silica and alumina formed on the basic film. The two films are bonded to each other by an adhesive film in a state that the respective moistureproof layers face to each other. The member may be also prepared with a reflection film such as a white PET film. The reflection films are bonded to each other by an adhesive film such as an EVA film, and an outer film 3 is further bonded onto the outer surface of the bonded reflection films. The EVA films used here and the adhesive conditions thereof are the same as the cases for bonding the moistureproof film and the outer films as described later.

Suitably used as the base film 2A for the moistureproof film 2, 2' is a transparent PET film having a thickness of 6–250 $\mu$m and the moistureproof layer is preferably formed to have a thickness of 5 $\mu$m or less. Suitably used as the reflection film 5 is a white PET film having a thickness of 6–250 $\mu$m.

An example of the outer film 3 is a fluororesin film having excellent ultraviolet resistance. Specific examples of fluororesin are polytetrafluoroethylene (PTFE), 4-fluoroethylene-perchloroalkoxy-copolymer (PFA), 4-fluoroethylene-6-fluoropropylene-copolymer (FEP), 2-ethylene-4-fluoroethylene copolymer (ETFE), poly3-chlorofluoroethylene (PCTFE), polyvinylidene fluoride (PVDF), and polyvinyl fluoride (PVF).

The thickness of the outer film 3 is preferably in a range between 12 $\mu$m and 200 $\mu$m.

The backside covering member 1 for solar battery of the present invention can be easily manufactured by interposing the EVA film 4 between the aforementioned moistureproof film 2 and the outer film 3, and heating and pressing them in the bonding condition of the EVA film 4 to laminate them integrally.

The thickness of the EVA film is preferably in a range between 5 $\mu$m and 50 $\mu$m.

Figure 4:
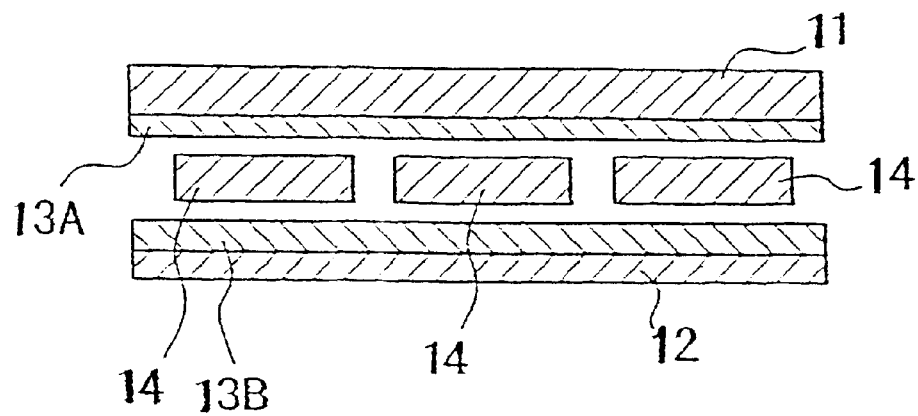
FIG. 4 is a sectional view showing a conventional solar battery.

To manufacture the solar battery of the present invention using the backside covering member for solar battery as mentioned above, the backside covering member of the present invention is used for sealing solar cells, instead of the conventional backside covering member shown in FIG. 4. It is preferable that the backside covering member is previously integrally laminated to a sealing EVA film and is used as the backside covering and sealing film of the present invention.

The backside covering and sealing film of the present invention comprises a backside covering member 1 made by integrally laminating an outer film 3 and a moistureproof film 2 via a EVA film 4 or a backside covering member 1A further including a reflection film 5, and a sealing EVA film 6 integrally laminated on a surface of the backside covering member 1 or 1A opposite to the outer film 3.

The thickness of the sealing EVA film 6 is preferably in a range between 0.1 mm and 1 mm.

The solar battery 10 of the present invention can be easily manufactured by integrally laminating a backside covering member 1, a sealing EVA film 6, solar cells such as silicon photovoltaic elements 7, a sealing EVA film 6, and a glass plate or a high-function lamination film as a surface-side transparent protective member 8 together. The stack is degassed, pressed, and heated according to the normal method i.e. by means of a vacuum laminator at a temperature of 120–150° C., with a time period for degassing 2–15 minutes, at a pressure of 0.5–1 atm, and a time period for pressing 8–45 minutes.

The EVA resin compound as a material of EVA films used in the backside covering member and the solar battery contains a cross-linking agent to have cross-linked structure for improving the weatherability.

An organic peroxide having radical generation temperature equal to or more than 100° C. is generally used as this cross-linking agent. More particularly, an organic peroxide having decomposition temperature equal to or more than 70° C. for a half life of 10 hours is preferably used in view of the stability when mixed. Specific examples used as the organic peroxide are 2,5-dimethylhexane; 2,5-dihydroperoxide; 2,5-dimethyl-2,5-di-(t-butylperoxy)hexane; 3-di-t-butylperoxide; t-dicumyl peroxide; 2,5-dimethyl-2,5-di(t-butyl-peroxy)hexane; dicumyl peroxide; $\alpha$, $\alpha'$-bis (t-butyl peroxy isopropyl)-benzene; n-buthyl-4,4-bis (t-butyl-peroxy)butane; 2,2-bis (t-butyl-peroxy)-butane; 1,1-bis (t-butyl-peroxy)cyclohexane; 1,1-bis (t-butyl-peroxy)-3,3,5-trimethylcyclohexane; t-butyl peroxy benzoate; and benzoyl peroxide. The content of the organic peroxide is generally 5 parts by weight or less, preferably 1–3 parts by weight, relative to 100 parts by weight of EVA resin.

The EVA resin preferably includes silane coupling agent in order to improve the adhesive property. Used as the silane coupling agent for this purpose may be one known in the art, for example, $\gamma$-chloropropyl trimethoxy silane; vinyltrichlorosilane; vinyltriethoxysilane; vinyl-tris ($\beta$-methoxyethoxy) silane; $\gamma$-methacryloxypropyl trimethoxy silane; $\beta$-(3,4-ethoxycyclohexyl) ethyl trimethoxy silane; $\gamma$-glycidoxypropyltrimetoxysilane; vinyltriacetoxy silane; $\gamma$-mercaptopropyl trimethoxy silane; $\gamma$-aminopropyl trim ethoxy silane; and N-$\beta$-(aminoethyl)-$\gamma$-aminopropyl trimethoxy silane. The content of the silane coupling agent is generally 5 parts by weight or less, preferably 0.1–2 parts by weight, relative to 100 parts by weight of EVA resin.

To increase the gel fraction of the EVA resin and improve the durability, a crosslinking aid may be added to the EVA. Specific examples of the crosslinking aid for this purpose are trifunctional crosslinking aids such as triallyl isocyanurate; triallyl isocyanate, monofunctional crosslinking aids such as NK ester. The content of the crosslinking aid is generally 10 parts by weight or less, preferably 1–5 parts by weight, relative to 100 parts by weight of EVA resin.

To improve the stability of the EVA resin, hydroquinone; hydroquinone monomethyl ether; p-benzoquinone; and/or methyl hydroquinone may be added. The content of such additive is generally 5 parts by weight or less relative to 100 parts by weight of EVA resin.

If necessary, in addition to the aforementioned additives, coloring agent, ultraviolet absorbing agent, antioxidant, antidiscoloration agent may be added. The coloring agent is exemplified by inorganic pigments such as metallic oxide and metal powder, organic pigments such as lake pigments of azo group, phthalocyanine group, azi group, acid dye group, and basic dye group. The ultraviolet absorbing agent is exemplified by benzophenone series compounds including 2-hydroxy-4octoxybenzophenone and 2-hydroxy-4-metoxy-5-surphobenzophenone, benzotriazole series compounds including 2-(2'-hydroxy-5-methylphenyl)-benzotoriazole, and hindered amine series compounds including phenylsulcylate and p-t-buthylphenylsulcylate. The antioxidant is exemplified by amine series compounds, phenol series compounds, bisphenyl series compound, and hinderdamine series compounds. Specific examples are di-t-butyl-p-cresol and bis(2,2,6,6-tetramethyl-4-piperazyl) sebacate.

Industrial Applicability

As described above, the backside covering member for solar battery of the present invention is light and thin, is excellent in moistureproof property and durability, and does not cause leakage of current. Therefore, by employing the backside covering member, a high-performance solar battery can be provided which has excellent moistureproof property, is thus prevented from corrosion, is excellent in the durability, and is prevented from deterioration due to leakage of current.

The backside covering and sealing film of the present invention is manufactured by integrally laminating the above backside covering member and an EVA film. Therefore, by employing the backside covering and sealing film, a high-performance solar battery which is lightweight and excellent in impact resistance and durability can be effectively manufactured with excellent workability.

The solar battery of the present invention employs the backside covering member of the present invention as a back side protective member and thus has high performance and excellent durability.

What is claimed is:

1. A backside covering member to be used as a protective member for protecting back sides of solar cells of a solar battery, comprising:

an outer film, a moistureproof film disposed on the outer film and formed of a base film and a coating layer of an inorganic oxide deposited on a surface of said base film, a reflection layer formed on a surface of said moistureproof film opposite to a surface on which said outer film is laminated, and ethylene-vinyl acetate copolymer adhesives situated for sealing between the outer film and the moistureproof film and between the moistureproof film and the reflection layer.

2. A backside covering member for solar battery as claimed in claim 1, wherein said moistureproof film is a laminate of two base films and the coating layer interposed between said base films.

3. A backside covering member for solar battery as claimed in claim 1, wherein the base film of said moistureproof film is a polyethylene terephthalate film and the coating layer of said moistureproof film is made of silica or alumina.

4. A backside covering member for solar battery as claimed in claim 1, wherein said outer film is made of fluororesin.

5. A backside covering member for solar battery as claimed in claim 4, wherein said fluororesin is one or two of a group including polytetrafluoroethylene, 4-fluoroethylene-perchloroalkoxy-copolymer, 4-fluoroethylene-6-fluoropropylene-copolymer, 2-ethylene-4-fluoroethylene-copolymer, poly3-chlorofluoroethylene, polyvinylidene fluoride, and polyvinyl fluoride.

6. A backside covering member for solar battery as claimed in claim 1, wherein said reflection layer is made of white polyethylene terephthalate.

7. A sealing film having a function as a protective member for protecting back sides of solar cells of a solar battery, comprising, the backside covering member as claimed in claim 1, and an ethylene-vinyl acetate copolymer film integrally laminated to a surface of said backside covering member opposite to the outer film.

8. A solar battery in which solar cells are sealed between a front side protective member and a back side protective member, wherein said back side protective member is the backside covering member as claimed in claim 1.

* * * * *